United States Patent
Wang

(10) Patent No.: US 10,109,651 B2
(45) Date of Patent: Oct. 23, 2018

(54) MANUFACTURE METHOD OF TFT SUBSTRATE AND STURCTURE THEREOF

(71) Applicant: Shenzhen China Star Optoelectronics Technology Co., Ltd., Shenzhen, Guangdong (CN)

(72) Inventor: Jun Wang, Guangdong (CN)

(73) Assignee: Shenzhen China Star Optoelectronics Technology Co., Ltd, Shenzhen, Guangdong (CN)

( * ) Notice: Subject to any disclaimer, the term of this patent is extended or adjusted under 35 U.S.C. 154(b) by 0 days.

(21) Appl. No.: 15/891,427

(22) Filed: Feb. 8, 2018

(65) Prior Publication Data
US 2018/0166471 A1 Jun. 14, 2018

Related U.S. Application Data

(62) Division of application No. 14/429,779, filed on Mar. 19, 2015, now Pat. No. 9,899,421.

(51) Int. Cl.
*H01L 27/24* (2006.01)
*H01L 27/28* (2006.01)
(Continued)

(52) U.S. Cl.
CPC ........ *H01L 27/1225* (2013.01); *H01L 27/124* (2013.01); *H01L 27/127* (2013.01); *H01L 27/1248* (2013.01); *H01L 29/41733* (2013.01); *H01L 29/42384* (2013.01); *H01L 29/45* (2013.01); *H01L 29/4908* (2013.01); *H01L 29/66742* (2013.01); *H01L 29/66969* (2013.01);
(Continued)

(58) Field of Classification Search
CPC ............... H01L 27/1225; H01L 27/124; H01L 27/1248; H01L 27/127; H01L 29/41733; H01L 29/42384; H01L 29/4908; H01L 29/66742; H01L 29/66969; H01L 29/78618; H01L 29/7869; H01L 29/45
See application file for complete search history.

(56) References Cited

U.S. PATENT DOCUMENTS 6,580,127 B1 * 6/2003 Andry .................... H01L 27/12
257/347
2006/0102907 A1 * 5/2006 Lee ..................... H01L 27/1214
257/72

(Continued)

*Primary Examiner* — Kenneth Parker
*Assistant Examiner* — Long H Le
(74) *Attorney, Agent, or Firm* — Andrew C. Cheng

(57) ABSTRACT

An oxide semiconductor TFT substrate includes a substrate, a gate and a first heavily doped transparent conducting layer formed on a substrate and covered by a gate isolation layer. An island shaped oxide semiconductor layer and an island shaped etching stopper layer are sequentially formed on the gate isolation layer with two side parts of the oxide semiconductor layer exposed outside the etching stopper layer. A source and a drain are formed on the two side parts of the oxide semiconductor layer to be in electrical connection therewith with a heavily doped transparent conducting layer therebetween. A protecting layer is formed on the source and the drain and is formed with a via. A pixel electrode extends through the via to electrically connect to the source and the drain with a heavily doped transparent conducting layer interposed therebetween and in direct contact therewith.

18 Claims, 4 Drawing Sheets

(51) Int. Cl.
    *H01L 29/45*       (2006.01)
    *H01L 29/49*       (2006.01)
    *H01L 27/12*       (2006.01)
    *H01L 29/423*     (2006.01)
    *H01L 29/786*     (2006.01)
    *H01L 29/66*       (2006.01)
    *H01L 29/417*     (2006.01)

(52) U.S. Cl.
    CPC .... *H01L 29/7869* (2013.01); *H01L 29/78618* (2013.01)

(56) References Cited

U.S. PATENT DOCUMENTS

2010/0051935 A1*   3/2010   Lee ................... H01L 27/1225
                                                                       257/43
2013/0171779 A1*   7/2013   Jeong ..................... C09D 5/00
                                                                       438/151

* cited by examiner

MANUFACTURE METHOD OF TFT SUBSTRATE AND STURCTURE THEREOF

CROSS REFERENCE TO RELATED APPLICATIONS

This is a divisional application of co-pending patent application Ser. No. 14/429,779, filed on Mar. 19, 2015, which is a national stage of PCT application number PCT/CN2014/086260, filed on Sep. 11, 2014, claiming foreign priority of Chinese patent application number 201410415944.5, filed on Aug. 21, 2014.

FIELD OF THE INVENTION

The present invention relates to a display technology field, and more particularly to a manufacture method of an oxide semiconductor TFT substrate and a structure thereof.

BACKGROUND OF THE INVENTION

A flat panel display possesses advantages of being ultra thin, power saved and radiation free and has been widely utilized. Present flat panel displays mainly comprise a LCD (Liquid Crystal Display) or an OLED (Organic Light Emitting Display).

To be compared with a well developed TFT-LCD, an OLED based on the Organic Light Emitting Diodes is an active light emitting display, which possesses outstanding properties of self-illumination, high contrast, wide view angle (up to 170°), fast response, high luminous efficiency, low operation voltage (3-10V), ultra-thin (thickness smaller than 2 mm) and etc. The display devices utilizing OLED technology has possibility to have a lighter, thinner, charming appearance, more excellent color display quality, wider view range and greater design flexibility.

Thin Film transistors (TFT) are important components of a flat panel display which can be formed on a glass substrate or a plastic substrate. Generally, the tin film transistors are employed as light switching-on elements and driving elements utilized such as LCDs, OLEDs, Electrophoresis Displays (EPD).

The oxide semiconductor TFT technology is the most popular skill at present. Because the carrier mobility of the oxide semiconductor is 20-30 times of the amorphous silicon semiconductor. With the higher electron mobility, it is capable of magnificently raising the charging/discharging rate of TFT to the pixel electrodes to promote the response speed of the pixels and to realize faster refreshing rate. In the mean time, the line scan rate of the pixels also can be promoted to make the manufacture of the flat panel display having ultra high resolution become possible. In comparison with the Low Temperature Poly-silicon (LTPS), the oxide semiconductor manufacture process is simpler and possesses higher compatibility with the amorphous silicon process. It can be applicable to the skill fields of Liquid Crystal Display, Organic Light Emitting Display, Flexible Display and etc. Because it fits the new generation production lines and has possible applications for displays with Large, Middle and Small sizes. The oxide semiconductor has the great opportunity of application development.

In a present oxide semiconductor TFT substrate structure, the oxide semiconductor layer generally directly contacts the source/the drain in general and electrical connections are formed therebetween. However, the ohm contact resistance between the oxide semiconductor layer and the source/the drain, the ohm contact resistance between the pixel electrode layer and the source/the drain are larger and leads to higher driving voltage, higher power consumption and lower response speed of the flat panel display.

The power saving is real a required topic to the development of the present society. Making great efforts to develop low power consumption flat panel display becomes an important target to all flat panel display manufacturers.

SUMMARY OF THE INVENTION

An objective of the present invention is to provide a manufacture method of an oxide semiconductor TFT substrate capable of improving the ohm contact between the oxide semiconductor layer and the source/the drain and the ohm contact between the pixel electrode layer and the source/the drain to reduce the ohm contact resistance. The threshold voltage of the flat panel display can be reduced, and accordingly the power consumption of the flat panel display can be effectively reduced and the response speed thereof can be raised.

Another objective of the present invention is to provide an oxide semiconductor TFT substrate structure, which the ohm contact resistance between the oxide semiconductor layer and the source/the drain and the ohm contact resistance between the pixel electrode layer and the source/the drain are smaller to lower the threshold voltage of the flat panel display and the power consumption of the flat panel display and to make the response speed faster.

For realizing the aforesaid objective, the present invention provides a manufacture method of an oxide semiconductor TFT substrate, comprising steps of:

step 1, providing a substrate, and sequentially depositing and patterning a first heavily doped transparent conducting thin film layer and a first metal layer on the substrate to form a gate and the first heavily doped transparent conducting thin film layer located at a lower surface of the gate with the same shape of the gate;

step 2, depositing a gate isolation layer on the gate and the substrate;

step 3, depositing and patterning an oxide semiconductor layer on the gate isolation layer to form an island shaped oxide semiconductor layer directly over the gate;

step 4, depositing and patterning an etching stopper layer on the island shaped oxide semiconductor layer and the gate isolation layer to form an island shaped etching stopper layer on the island shaped oxide semiconductor layer;

a width of the island shaped etching stopper layer is smaller than a width of the island shaped oxide semiconductor layer; the island shaped etching stopper layer covers a central part of the island shaped oxide semiconductor layer and exposes two side parts of the island shaped oxide semiconductor layer;

step 5, sequentially depositing and patterning a second heavily doped transparent conducting thin film layer, a second metal layer and a third heavily doped transparent conducting thin film layer on the island shaped etching stopper layer and the gate isolation layer to form a source/a drain, the second heavily doped transparent conducting thin film layer located at a lower surface of the source/the drain with the same shape of the source/the drain and the third heavily doped transparent conducting thin film layer located at an upper surface of the source/the drain with the same shape of the source/the drain;

the source/the drain contact the two side parts of the island shaped oxide semiconductor layer via the second heavily doped transparent conducting thin film layer to establish electrical connections;

step 6, deposing and patterning a protecting layer on the third heavily doped transparent conducting thin film layer and the etching stopper layer to form a via located at one side of the island shaped oxide semiconductor layer;

step 7, deposing and patterning a pixel electrode layer on the protecting layer;

the pixel electrode layer fills the via and contacts the source/the drain via the third heavily doped transparent conducting thin film layer to establish electrical connections;

step 8, implementing anneal process to the substrate obtained in the seventh step.

Material of the source/the drain is copper, and material of the pixel electrode layer is ITO or IZO.

Material of the first heavily doped transparent conducting thin film layer, the second heavily doped transparent conducting thin film layer and the third heavily doped transparent conducting thin film layer is heavily doped ITO or heavily doped IZO.

Thicknesses of the first heavily doped transparent conducting thin film layer, the second heavily doped transparent conducting thin film layer and the third heavily doped transparent conducting thin film layer are respectively in a range of 5-200 nm.

The thickness of the first heavily doped transparent conducting thin film layer is 10 nm, and the thickness of the second heavily doped transparent conducting thin film layer is 15 nm, and the thickness of the third heavily doped transparent conducting thin film layer is 10 nm.

The island shaped oxide semiconductor layer is an IGZO semiconductor layer.

Material of the protecting layer is $SiO_2$ or SiON.

Operations of the patterning are accomplished by photolithography process and etching process.

The present invention further provides an oxide semiconductor TFT substrate structure, comprising a substrate, a gate on the substrate, a first heavily doped transparent conducting thin film layer at a lower surface of the gate with the same shape of the gate, a gate isolation layer on the gate and the substrate, an island shaped oxide semiconductor layer directly over the gate on the gate isolation layer, an island shaped etching stopper layer on the island shaped oxide semiconductor layer, a source/a drain on the island shaped etching stopper layer and the gate isolation layer, a second metal layer and a third heavily doped transparent conducting thin film layer at a lower surface of the source/the drain with the same shape of the source/the drain, a third heavily doped transparent conducting thin film layer located at an upper surface of the source/the drain with the same shape of the source/the drain, a protecting layer on the third heavily doped transparent conducting thin film layer and the etching stopper layer and a pixel electrode layer on the protecting layer; the island shaped oxide semiconductor layer comprises a central part and two side parts; a width of the island shaped etching stopper layer is smaller than a width of the oxide semiconductor layer and only a central part is covered; the source/the drain contact the two side parts via the second heavily doped transparent conducting thin film layer to establish electrical connections; the protecting layer comprises a via located at one side of the island shaped oxide semiconductor layer, and the pixel electrode layer fills the via and contacts the source/the drain via the third heavily doped transparent conducting thin film layer to establish electrical connections.

Material of the source/the drain is copper, material of the first heavily doped transparent conducting thin film layer, and the second heavily doped transparent conducting thin film layer and the third heavily doped transparent conducting thin film layer is heavily doped ITO or heavily doped IZO, the island shaped oxide semiconductor layer is an IGZO semiconductor layer, and material of the protecting layer is $SiO_2$ or SiON, and material of the pixel electrode layer is ITO or IZO; thicknesses of the first heavily doped transparent conducting thin film layer, the second heavily doped transparent conducting thin film layer and the third heavily doped transparent conducting thin film layer are respectively in a range of 5-200 nm.

The benefits of the present invention are: according to the manufacture method of the oxide semiconductor TFT structure of the present invention, by locating the second heavily doped transparent conducting thin film layer and the third heavily doped transparent conducting thin film layer at the upper, lower surfaces of the source/the drain, it is capable of promoting the ohm contact between the oxide semiconductor layer and the source/the drain and the ohm contact between the pixel electrode layer and the source/the drain to reduce the ohm contact resistance. The threshold voltage of the flat panel display can be reduced, and accordingly the power consumption of the flat panel display can be effectively reduced and the response speed thereof can be raised; according to the oxide semiconductor TFT structure of the present invention, with the second heavily doped transparent conducting thin film layer and the third heavily doped transparent conducting thin film layer at the upper, lower surfaces of the source/the drain, the ohm contact resistance between the oxide semiconductor layer and the source/the drain and the ohm contact resistance between the pixel electrode layer and the source/the drain can be smaller to lower the threshold voltage of the flat panel display and the power consumption of the flat panel display and to make the response speed faster.

BRIEF DESCRIPTION OF THE DRAWINGS

The technical solution, as well as beneficial advantages, of the present invention will be apparent from the following detailed description of an embodiment of the present invention, with reference to the attached drawings.

In drawings.

DETAILED DESCRIPTION OF PREFERRED EMBODIMENTS

In order to better understand the characteristics and technical aspect of the invention, please refer to the following detailed description of the present invention is concerned with the diagrams.

Figure 1:
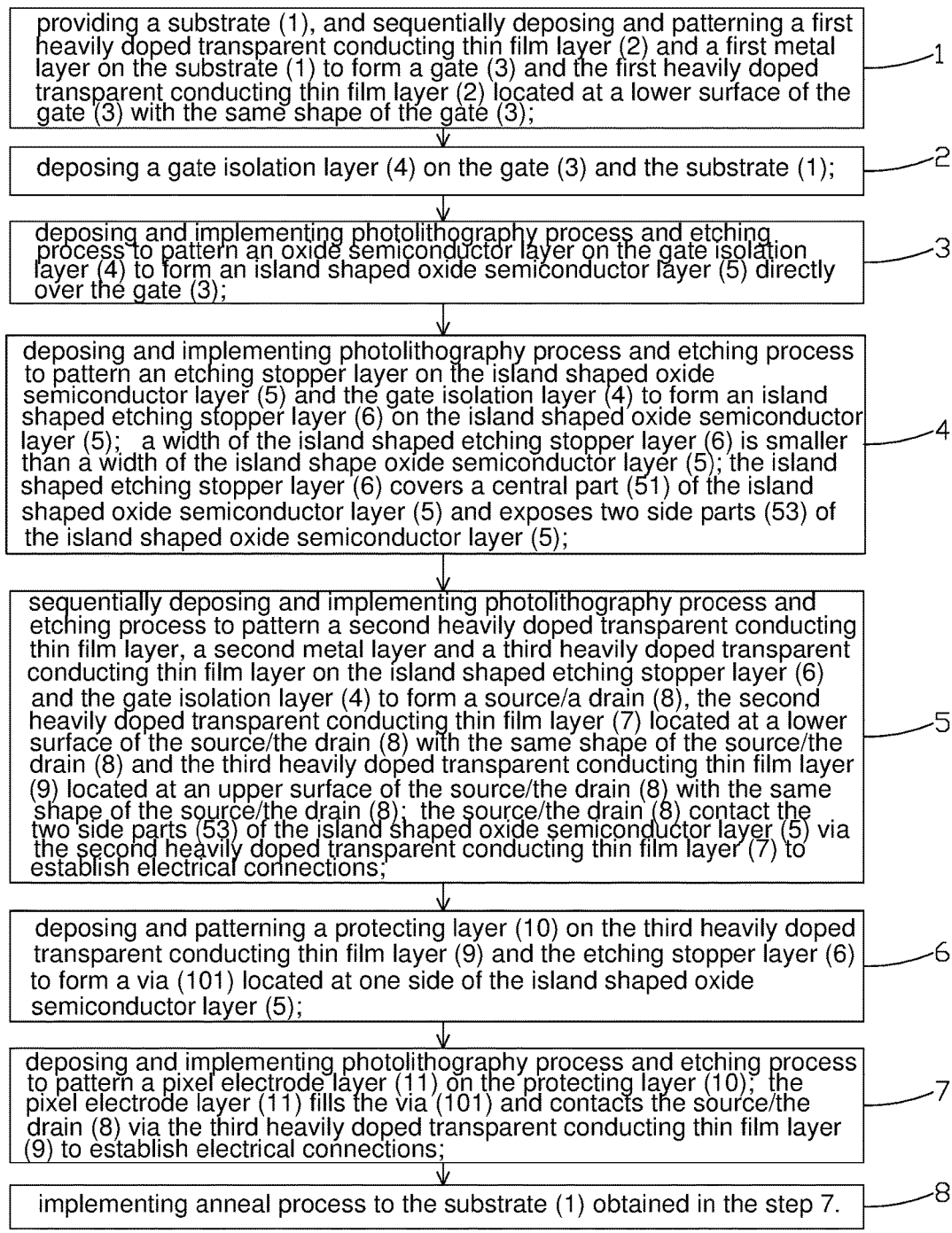
FIG. 1 is a flowchart of a manufacture method of an oxide semiconductor TFT substrate according to the present invention.
Figure 2:
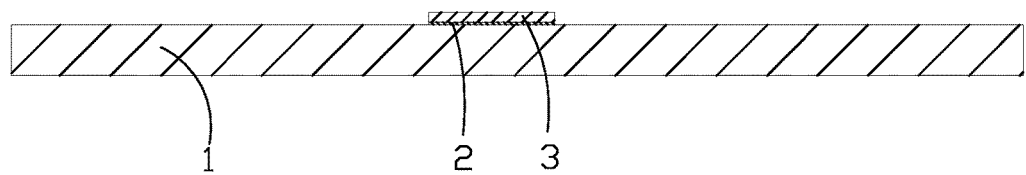
FIG. 2 is a diagram of step 1 in the manufacture method of the oxide semiconductor TFT substrate according to the present invention.

Please refer to FIG. 1, which is a flowchart of a manufacture method of an oxide semiconductor TFT substrate according to the present invention, comprising steps of:

step 1, please refer to FIG. 2, providing a substrate 1, and sequentially deposing and patterning a first heavily doped transparent conducting thin film layer 2 and a first metal layer on the substrate 1 to form a gate 3 and the first heavily doped transparent conducting thin film layer 2 located at a lower surface of the gate 3 with the same shape of the gate 3.

The substrate 1 is a transparent substrate. Preferably, the substrate 1 is a glass substrate.

In the step 1, the photolithography process is implemented with one general mask, and then the etching process is implemented to pattern the first heavily doped transparent conducting thin film layer and the first metal layer to form the gate 3 and the first heavily doped transparent conducting thin film layer 2 located at a lower surface of the gate 3 with the same shape of the gate 3.

The material of the gate 3 is copper (Cu).

Figure 3:
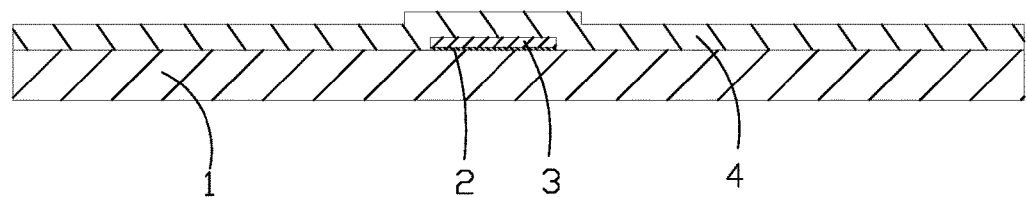
FIG. 3 is a diagram of step 2 in the manufacture method of the oxide semiconductor TFT substrate according to the present invention.

The material of the first heavily doped transparent conducting thin film layer 2 is heavily doped Indium titanium oxide (ITO) or heavily doped Indium zinc oxide (IZO). The thickness of the first heavily doped transparent conducting thin film layer 2 is in a range of 5-200 nm. Preferably, the thickness of the first heavily doped transparent conducting thin film layer 2 is 10 nm. The first heavily doped transparent conducting thin film layer 2 is capable of increasing the adhesive force between the gate 3 and the substrate 1 to improve the adhesive strength therebetween.

step 2, please refer to FIG. 3, deposing a gate isolation layer 4 on the gate 3 and the substrate 1.

Figure 4:
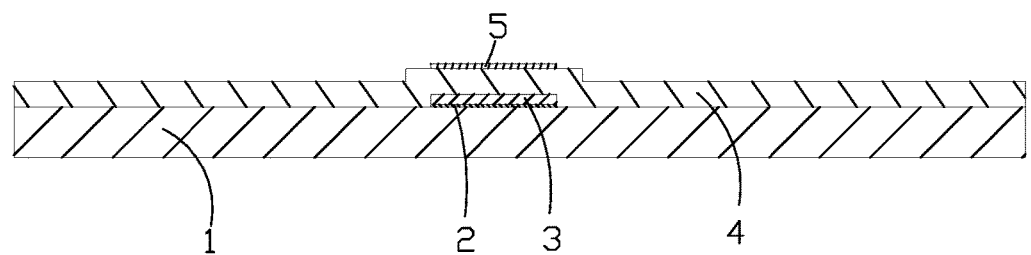
FIG. 4 is a diagram of step 3 in the manufacture method of the oxide semiconductor TFT substrate according to the present invention.

The gate isolation layer 4 covers the entire gate 3 and substrate 1.

step 3, please refer to FIG. 4, deposing and implementing photolithography process and etching process to pattern an oxide semiconductor layer on the gate isolation layer 4 to form an island shaped oxide semiconductor layer 5 directly over the gate 3.

Figure 5:
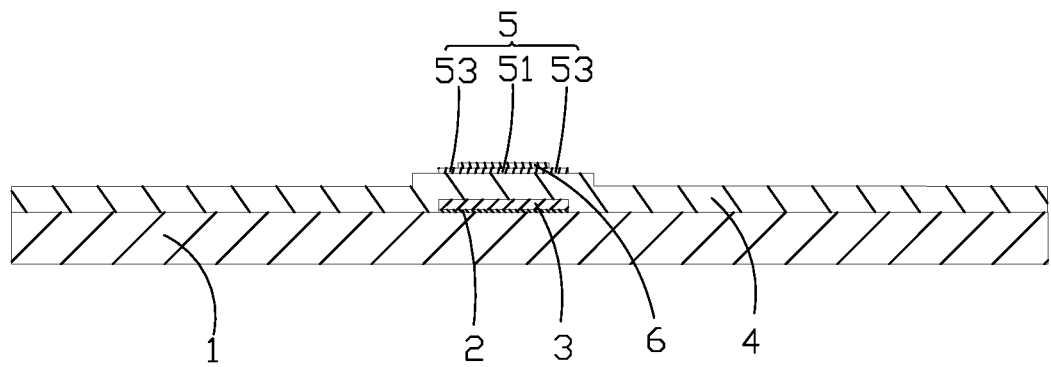
FIG. 5 is a diagram of step 4 in the manufacture method of the oxide semiconductor TFT substrate according to the present invention.

Specifically, the island shaped oxide semiconductor layer 5 is an Indium gallium zinc oxide (IGZO) semiconductor layer.

step 4, please refer to FIG. 5, deposing and implementing photolithography process and etching process to pattern an etching stopper layer on the island shaped oxide semiconductor layer 5 and the gate isolation layer 4 to form an island shaped etching stopper layer 6 on the island shaped oxide semiconductor layer 5.

Figure 6:
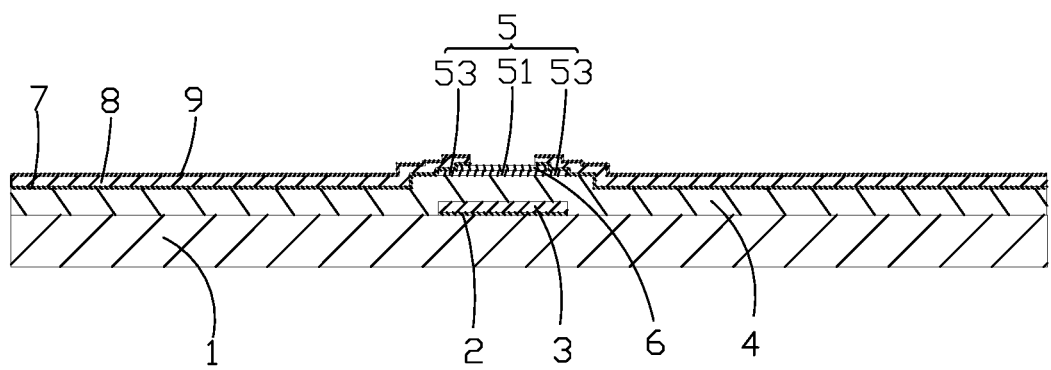
FIG. 6 is a diagram of step 5 in the manufacture method of the oxide semiconductor TFT substrate according to the present invention.

Furthermore, a width of the island shaped etching stopper layer 6 is smaller than a width of the oxide semiconductor layer 5; the island shaped etching stopper layer 6 covers a central part 51 of the island shaped oxide semiconductor layer 5 and exposes two side parts 53 of the island shaped oxide semiconductor layer 5.

step 5, please refer to FIG. 6, sequentially deposing and implementing photolithography process and etching process to pattern a second heavily doped transparent conducting thin film layer, a second metal layer and a third heavily doped transparent conducting thin film layer on the island shaped etching stopper layer 6 and the gate isolation layer 4 to form a source/a drain 8, the second heavily doped transparent conducting thin film layer 7 located at a lower surface of the source/the drain 8 with the same shape of the source/the drain 8 and the third heavily doped transparent conducting thin film layer 9 located at an upper surface of the source/the drain 8 with the same shape of the source/the drain 8.

Specifically, material of the second and the third heavily doped transparent conducting thin film layer 7, 9 is heavily doped ITO or heavily doped IZO; and the thicknesses of the second and the third heavily doped transparent conducting thin film layer 7, 9 are respectively in a range of 5-200 nm, and preferably, the thickness of the second heavily doped transparent conducting thin film layer 7 is 15 nm, and the thickness of the third heavily doped transparent conducting thin film layer 9 is 10 nm.

The material of the source/the drain 8 is Cu.

Figure 7:
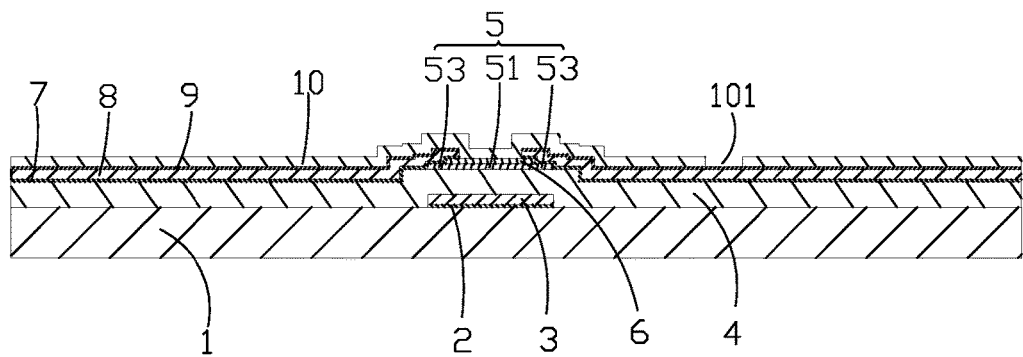
FIG. 7 is a diagram of step 6 in the manufacture method of the oxide semiconductor TFT substrate according to the present invention.

The source/the drain 8 contact the two side parts 53 of the island shaped oxide semiconductor layer 5 via the second heavily doped transparent conducting thin film layer 7 to establish electrical connections. The second heavily doped transparent conducting thin film layer 7 has stronger conducting ability. As it is employed as a contact transition layer, the ohm contact resistance between the source/the drain 8 and the island shaped oxide semiconductor layer 5 can be effectively reduced. Accordingly, the threshold voltage of the flat panel display and the power consumption of the flat panel display can be lowered to realize the objective of raising the response speed.

step 6, please refer to FIG. 7, deposing and patterning a protecting layer 10 on the third heavily doped transparent conducting thin film layer 9 and the etching stopper layer 6 to form a via 101 located at one side of the island shaped oxide semiconductor layer 5.

Figure 8:
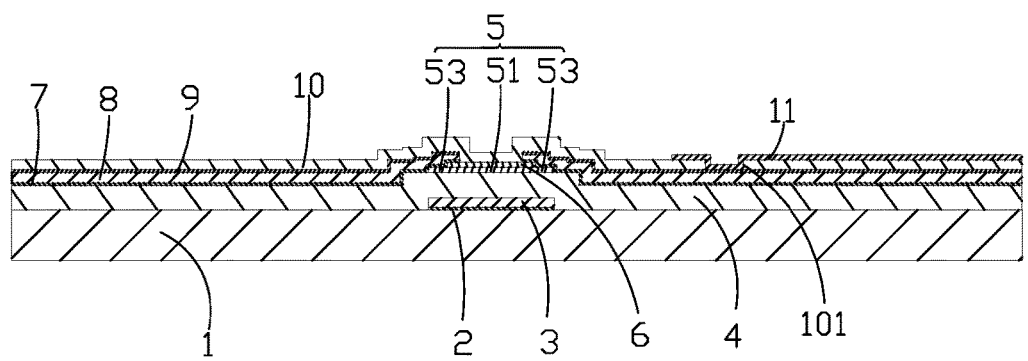
FIG. 8 is a diagram of step 7 in the manufacture method of the oxide semiconductor TFT substrate according to the present invention and a diagram of the oxide semiconductor TFT substrate structure according to the present invention.

Specifically, the material of the protecting layer 10 is silicon dioxide ($SiO_2$) or silicon oxynitride (SiON).

step 7, please refer to FIG. 8, deposing and implementing photolithography process and etching process to pattern a pixel electrode layer 11 on the protecting layer 10.

Specifically, the material of the pixel electrode layer 11 is ITO or IZO.

The pixel electrode layer 11 fills the via 101 and contacts the source/the drain 8 via the third heavily doped transparent conducting thin film layer 9 to establish electrical connections. The third heavily doped transparent conducting thin film layer 9 has stronger conducting ability. As it is employed as a contact transition layer, the ohm contact resistance between the source/the drain 8 and the pixel electrode layer 11 can be effectively reduced. Accordingly, the threshold voltage of the flat panel display and the power consumption of the flat panel display can be lowered to realize the objective of raising the response speed.

step 8, implementing anneal process to the substrate 1 obtained in the step 7 to accomplish the manufacture of the oxide semiconductor TFT substrate.

Please refer to FIG. 8. On the basis of the aforesaid manufacture method of the oxide semiconductor TFT substrate, the present invention further provides an oxide semiconductor TFT substrate structure, comprising a substrate 1, a gate 3 on the substrate 1, a first heavily doped transparent conducting thin film layer at a lower surface of the gate with the same shape of the gate, a gate isolation layer 4 on the gate 3 and the substrate 1, an island shaped oxide semiconductor layer 5 directly over the gate 3 on the gate isolation layer 4, an island shaped etching stopper layer 6 on the island shaped oxide semiconductor layer 5, a source/a drain 8 on the island shaped etching stopper layer 6 and the gate isolation layer 4, a third heavily doped transparent conducting thin film layer 7 at a lower surface of the source/the drain 8 with the same shape of the source/the drain 8, a third heavily doped transparent conducting thin film layer 9 located at an upper surface of the source/the drain 8 with the same shape of the source/the drain 8, a protecting layer 10 on the third heavily doped transparent conducting thin film layer 9 and the etching stopper layer 6 and a pixel electrode layer 11 on the protecting layer 10.

The island shaped oxide semiconductor layer 5 comprises a central part 51 and two side parts 53, a width of the island shaped etching stopper layer 6 is smaller than a width of the oxide semiconductor layer 5 and only a central part 51 is covered. The source/the drain 8 contact the two side parts 53 via the second heavily doped transparent conducting thin film layer 7 to establish electrical connections. The ohm contact resistance between the oxide semiconductor layer 5 and the source/the drain 8 can be smaller to reduce the threshold voltage and the power consumption of the flat panel display accordingly. The response speed can be faster. The protecting layer 10 comprises a pixel electrode via 101 located at one side of the island shaped oxide semiconductor layer 5, and the pixel electrode layer 11 fills the via 101 and contacts the source/the drain 8 via the third heavily doped transparent conducting thin film layer 9 to establish electrical connections. The ohm contact resistance between the pixel electrode layer 11 and the source/the drain 8 can be smaller to reduce the threshold voltage and the power consumption of the flat panel display accordingly. The response speed can be faster.

Specifically, material of the gate 3 and the source/the drain 8 is copper, material of the first heavily doped transparent conducting thin film layer 2, and the second heavily doped transparent conducting thin film layer 7 and the third heavily doped transparent conducting thin film layer 9 is heavily doped ITO or heavily doped IZO; the island shaped oxide semiconductor layer 5 is an IGZO semiconductor layer, and material of the protecting layer 10 is $SiO_2$ or SiON; material of the pixel electrode layer is ITO or IZO; thicknesses of the first heavily doped transparent conducting thin film layer 2, the second heavily doped transparent conducting thin film layer 7 and the third heavily doped transparent conducting thin film layer 9 are respectively in a range of 5-200 nm. Preferably, the thickness of the first heavily doped transparent conducting thin film layer 2 is 10 nm, and the thickness of the second heavily doped transparent conducting thin film layer 7 is 15 nm, and the thickness of the third heavily doped transparent conducting thin film layer 9 is 10 nm.

In conclusion, according to the manufacture method of the oxide semiconductor TFT structure of the present invention, by locating the second heavily doped transparent conducting thin film layer and the third heavily doped transparent conducting thin film layer at the upper, lower surfaces of the source/the drain, it is capable of promoting the ohm contact between the oxide semiconductor layer and the source/the drain and the ohm contact between the pixel electrode layer and the source/the drain to reduce the ohm contact resistance. The threshold voltage of the flat panel display can be reduced, and accordingly the power consumption of the flat panel display can be effectively reduced and the response speed thereof can be raised; according to the oxide semiconductor TFT structure of the present invention, with the second heavily doped transparent conducting thin film layer and the third heavily doped transparent conducting thin film layer at the upper, lower surfaces of the source/the drain, the ohm contact resistance between the oxide semiconductor layer and the source/the drain and the ohm contact resistance between the pixel electrode layer and the source/the drain can be smaller to lower the threshold voltage of the flat panel display and the power consumption of the flat panel display and to make the response speed faster.

Above are only specific embodiments of the present invention, the scope of the present invention is not limited to this, and to any persons who are skilled in the art, change or replacement which is easily derived should be covered by the protected scope of the invention. Thus, the protected scope of the invention should go by the subject claims.

What is claimed is:

1. An oxide semiconductor thin-film transistor (TFT) substrate structure, comprising:
   a substrate;
   a gate, which is formed on the substrate;
   a first heavily doped transparent conducting thin film layer, which is formed on a lower surface of the gate and having a shape identical to a shape of the gate;
   a gate isolation layer, which is formed on the gate and the substrate;
   an island shaped oxide semiconductor layer, which is formed on the gate isolation layer at a location corresponding to and directly above the gate;
   an island shaped etching stopper layer, which is formed on the island shaped oxide semiconductor layer;
   a source and a drain, which are formed on the island shaped etching stopper layer and the gate isolation layer;
   a second heavily doped transparent conducting thin film layer, which is formed on a lower surface of the source and the drain and having a shape identical to a shape of the source and the drain;
   a third heavily doped transparent conducting thin film layer, which is formed on at an upper surface of the source and the drain and having a shape identical to the shape of the source and the drain;
   a protecting layer, which is formed on the third heavily doped transparent conducting thin film layer and the etching stopper layer; and
   a pixel electrode layer, which is formed on the protecting layer;
   wherein the island shaped oxide semiconductor layer has a width and comprises a central part and two side parts;
   the island shaped etching stopper layer has a width that is smaller than the width of the island shaped oxide semiconductor layer so as to cover only the central part of the island shaped oxide semiconductor layer with the two side parts of the island shaped oxide semiconductor layer exposed outside the island shaped etching stopper layer;
   the source and the drain are set in contact engagement with the two side parts of the island shaped oxide semiconductor layer through the second heavily doped transparent conducting thin film layer so as to establish electrical connection between each of the source and the drain with the island shaped oxide semiconductor layer; and
   the protecting layer comprises a via formed therethrough at one side of the island shaped oxide semiconductor layer, such that the pixel electrode layer extends through the via and contacts one of the source and the drain through the third heavily doped transparent conducting thin film layer, wherein the third heavily doped transparent conducting thin film layer is partly interposed between and in direct contact engagement with the one of the source and the drain and the pixel electrode to establish electrical connection between the one of the source and the drain and the pixel electrode with reduced ohm contact resistance between the one of the source and the drain and the pixel electrode.

2. The TFT substrate structure according to claim 1, wherein the source and the drain are formed of a material comprising copper.

3. The TFT substrate structure according to claim 1, wherein the first heavily doped transparent conducting thin film layer, the second heavily doped transparent conducting thin film layer, and the third heavily doped transparent conducting thin film layer are each formed of a material comprising one of heavily doped ITO and heavily doped IZO.

4. The TFT substrate structure according to claim 1, wherein the island shaped oxide semiconductor layer comprises an IGZO semiconductor layer.

5. The TFT substrate structure according to claim 1, wherein the protecting layer is formed of a material comprising one of $SiO_2$ and SiON.

6. The TFT substrate structure according to claim 1, wherein the pixel electrode layer is formed of a material comprising one of ITO and IZO.

7. The TFT substrate structure according to claim 1, wherein the first heavily doped transparent conducting thin film layer, the second heavily doped transparent conducting thin film layer, and the third heavily doped transparent conducting thin film layer each have a thickness in a range of 5-200 nm.

8. The TFT substrate structure according to claim 7, wherein the thickness of the first heavily doped transparent conducting thin film layer is 10 nm.

9. The TFT substrate structure according to claim 7, wherein the thickness of the second heavily doped transparent conducting thin film layer is 15 nm.

10. The TFT substrate structure according to claim 7, wherein the thickness of the third heavily doped transparent conducting thin film layer is 10 nm.

11. An oxide semiconductor thin-film transistor (TFT) substrate structure, comprising:
a substrate;
a gate, which is formed on the substrate;
a first heavily doped transparent conducting thin film layer, which is formed on a lower surface of the gate and having a shape identical to a shape of the gate;
a gate isolation layer, which is formed on the gate and the substrate;
an island shaped oxide semiconductor layer, which is formed on the gate isolation layer at a location corresponding to and directly above the gate;
an island shaped etching stopper layer, which is formed on the island shaped oxide semiconductor layer;
a source and a drain, which are formed on the island shaped etching stopper layer and the gate isolation layer;
a second heavily doped transparent conducting thin film layer, which is formed on a lower surface of the source and the drain and having a shape identical to a shape of the source and the drain;
a third heavily doped transparent conducting thin film layer, which is formed on at an upper surface of the source and the drain and having a shape identical to the shape of the source and the drain;
a protecting layer, which is formed on the third heavily doped transparent conducting thin film layer and the etching stopper layer; and
a pixel electrode layer, which is formed on the protecting layer;
wherein the island shaped oxide semiconductor layer has a width and comprises a central part and two side parts;
the island shaped etching stopper layer has a width that is smaller than the width of the island shaped oxide semiconductor layer so as to cover only the central part of the island shaped oxide semiconductor layer with the two side parts of the island shaped oxide semiconductor layer exposed outside the island shaped etching stopper layer;
the source and the drain are set in contact engagement with the two side parts of the island shaped oxide semiconductor layer through the second heavily doped transparent conducting thin film layer so as to establish electrical connection between each of the source and the drain with the island shaped oxide semiconductor layer; and
the protecting layer comprises a via formed therethrough at one side of the island shaped oxide semiconductor layer, such that the pixel electrode layer extends through the via and contacts one of the source and the drain through the third heavily doped transparent conducting thin film layer, wherein the third heavily doped transparent conducting thin film layer is partly interposed between and in direct contact engagement with the one of the source and the drain and the pixel electrode to establish electrical connection between the one of the source and the drain and the pixel electrode with reduced ohm contact resistance between the one of the source and the drain and the pixel electrode; and
wherein the source and the drain are formed of a material comprising copper;
the pixel electrode layer is formed of a material comprising one of ITO and IZO; and
the third heavily doped transparent conducting thin film layer is formed of a material comprising one of heavily doped ITO and heavily doped IZO.

12. The TFT substrate structure according to claim 11, wherein the first heavily doped transparent conducting thin film layer and the second heavily doped transparent conducting thin film layer are each formed of a material comprising one of heavily doped ITO and heavily doped IZO.

13. The TFT substrate structure according to claim 11, wherein the island shaped oxide semiconductor layer comprises an IGZO semiconductor layer.

14. The TFT substrate structure according to claim 11, wherein the protecting layer is formed of a material comprising one of $SiO_2$ and SiON.

15. The TFT substrate structure according to claim 11, wherein the first heavily doped transparent conducting thin film layer, the second heavily doped transparent conducting thin film layer, and the third heavily doped transparent conducting thin film layer each have a thickness in a range of 5-200 nm.

16. The TFT substrate structure according to claim 15, wherein the thickness of the first heavily doped transparent conducting thin film layer is 10 nm.

17. The TFT substrate structure according to claim 15, wherein the thickness of the second heavily doped transparent conducting thin film layer is 15 nm.

18. The TFT substrate structure according to claim 15, wherein the thickness of the third heavily doped transparent conducting thin film layer is 10 nm.

* * * * *